US006977510B1

(12) United States Patent
Arigliano

(10) Patent No.: US 6,977,510 B1
(45) Date of Patent: Dec. 20, 2005

(54) VERY PRECISE RESISTANCE MEASUREMENT

(75) Inventor: Antonello Arigliano, Germering (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 10/880,404

(22) Filed: Jun. 29, 2004

(30) Foreign Application Priority Data

Jun. 14, 2004 (EP) .................................. 04392032

(51) Int. Cl.[7] .............................................. G01R 27/02
(52) U.S. Cl. ....................... 324/549; 324/691; 280/735
(58) Field of Search ................................ 324/549, 691, 324/705, 712, 719; 340/438; 280/735, 734

(56) References Cited

U.S. PATENT DOCUMENTS 5,506,509 A * 4/1996 Susak ......................... 324/550
6,133,749 A 10/2000 Hansen et al. ................ 326/30
6,498,494 B2 12/2002 Belau et al. ................ 324/522

FOREIGN PATENT DOCUMENTS

EP 0454012 A 10/1991 .......... G01R 27/00
EP 0701928 A 3/1996 ........... B60R 21/00

* cited by examiner

*Primary Examiner*—Vincent Q. Nguyen
(74) *Attorney, Agent, or Firm*—George O. Saile; Stephen B. Ackerman

(57) ABSTRACT

A circuit and a related method to measure very precisely the resistance Rm of a small resistor independent from process and temperature variations. This resistor may be the RON resistance of an external sensor or e.g. the resistance of a safety device as a squib. A constant current source provides a current IBIAS causing a voltage drop Vm at the resistor to be measured. Using a configuration of operational amplifiers and current mirrors, wherein one of the current mirrors has a gain of n, an output voltage VOUT is achieved, which is defined by VOUT=n×Rm×IBIAS. The gain n of a current mirror allows a very precise measurement of the resistance Rm of the resistor to be measured. The output voltage is finally converted from analog to digital values.

13 Claims, 2 Drawing Sheets

VERY PRECISE RESISTANCE MEASUREMENT

BACKGROUND OF THE INVENTION (1) Field of the Invention

This invention relates generally to electrical resistance measurement and relates more particularly to a very precise measurement of the resistance of small resistors using a semiconductor circuit.

(2) Description of the Prior Art

Monitoring the resistance regularly of e.g. external sensors or of safety devices as squibs for airbags or other devices for automotive or aviation applications is an important task. This measurement must be reliable, precise and fast and it may not impede the normal application of the sensor, or resistor whatever. This measurement has often to be performed almost constantly in short time intervals.

A challenge to the designers of electronic circuits is to find an efficient solution to measure the resistance of such devices periodically. There are various patents available dealing amongst other purposes with the measurement of resistances.

U.S. Patent (U.S. Pat. No. 6,133,749 to Hansen et al.) describes a programmable variable impedance output driver circuit using analog biases to match driver output impedance to load input impedance. A current mirror is used to obtain a measurement of an external resistance value for matching the impedance of a driven load. The mirrored current generates the voltage “NBIAS” when passed through the resistively connected NFET. Similarly, the current is again mirrored and passed through a resistively connected PFET resulting in the voltage “PBIAS”. The analog bias voltages, NBIAS and PBIAS are used to vary the impedance of complementary FETs in an impedance matched driver for a high degree of dI/dt control. The driver provides a high degree of flexibility because its turn-on and turn-off characteristics do not depend on a combination of digital control signals connected directly to the driving FETs as in the prior art. Instead, the PBIAS and NBIAS signals provide analog controls which may be applied to single transistors whose impedance changes as PBIAS and NBIAS increase or decrease.

U.S. Patent (U.S. Pat. No. 6,498,494 to Belau et al.) discloses how the resistance value and the leakage current of a load can be measured simultaneously. A load current is fed, mirrored by electrical power supplies into a resistance measuring circuit and a leakage current measuring circuit. This permits rapid, precise measurement of a plurality of loads by a single measuring circuit connected via one multiplexer. The firing transistors can be distributed among different ASICs or provided jointly for a plurality of firing caps.

SUMMARY OF THE INVENTION

A principal objective of the present invention is to achieve a circuit to measure very precisely the resistance Rm of a small resistor independent from process and temperature variations.

A principal objective of the present invention is to achieve a method to measure very precisely the resistance Rm of a small resistor independent from process and temperature variations.

In accordance with the objects of this invention a circuit to measure very precisely the resistance of a small resistor independent from process and temperature variations has been achieved. Said circuit comprises, firstly, a constant current source, a resistor to be measured, wherein a first terminal of the resistor is connected to said current source, to a first input of a third means to clamp voltage and via a switch to any application circuitry, and a second terminal is connected to a first means to clamp voltage and via another switch to an application circuitry, wherein said both switches are open during a resistance measurement of the resistor, and a pair of switching means, wherein each of the switching means is between one terminal of said resistor to be measured and a circuitry of any application. Furthermore said circuit comprises a first means to clamp voltage, having two inputs and an output, wherein the first input is a reference voltage and the second input is a feedback from the output of said means to clamp voltage and wherein the current provided by said current source is flowing through the first means to clamp a voltage to ground and its output is connected to a first input of a second means to clamp a voltage, a second means to a clamp a voltage having two inputs and an output, wherein the first input is the output of said first means to clamp a voltage and the second input is a feedback from its own output and it is generating at its output a current $I_1$ flowing from $V_{DD}$ voltage through a first resistor to ground. Furthermore said circuit comprises a first, a second and a third resistor all having the same resistance, a first current mirror comprising a first and a second PMOS transistor, having both the same size, mirroring said current $I_1$, and a third means to clamp a voltage having two inputs and an output, wherein the first input connected to a first terminal of said resistor to be measured and the second input is a feedback from its own output and it is generating at its output a current $I_3$ flowing from $V_{DD}$ voltage and a current $I_2$ through a second resistor to ground, wherein $I_2$ and $I_3$ are connected to the mirrored current $I_1$ in a way that $I_3$ plus $I_1$ equals $I_2$. Finally said circuit comprises a current mirror comprising a first and a second PMOS transistor, having a gain n, mirroring said current $I_3$, wherein the size of the second PMOS transistor is n-times larger than the size of the first transistor, and wherein a mirrored current $I_4$ is generated, amplified by the gain n, flowing via the third resistor to ground and providing an analog output voltage, and an analog-to digital converter converting said output voltage to digital values.

In accordance with the objects of this invention a method to measure very precisely the resistance of a small resistor independent from process and temperature variations has been achieved. Said method comprises, firstly, providing a resistor Rm to be measured, a reference voltage VREF, and a circuit comprising a constant current source, a pair of switching means, a number of means to clamp a voltage, a number of current mirrors, wherein at least one current mirror has a gain of n, a number of resistors having all the same value R, and a analog-to digital converter. The next step of the method invented are to disconnect resistor Rm from its application circuitry, to provide a constant current IBIAS through the resistor Rm to be measured causing a voltage drop Vm, and to generate a current $I_1$ defined by $$I_1 = \frac{V_{REF}}{R}.$$

The following steps of the method invented are to generate a current $I_2$ defined by $$I_2 = \frac{V_{REF} + Vm}{R},$$

to generate a current $I_3$ which is defined by $$I_3 = I_2 - I_1 = \frac{V_m}{R}$$

to generate a current $I_4$ defined by $I_4=n\times I_3$ causing a voltage drop Vout=n×Rm×IBIAS, and to convert VOUT from analog to digital values.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a novel circuit and a related method to measure very precisely the resistance of a small resistor independent from process and temperature variations.

In many applications the resistance of external sensors or safety devices as e.g. a squib needs to be monitored.

Figure 1:
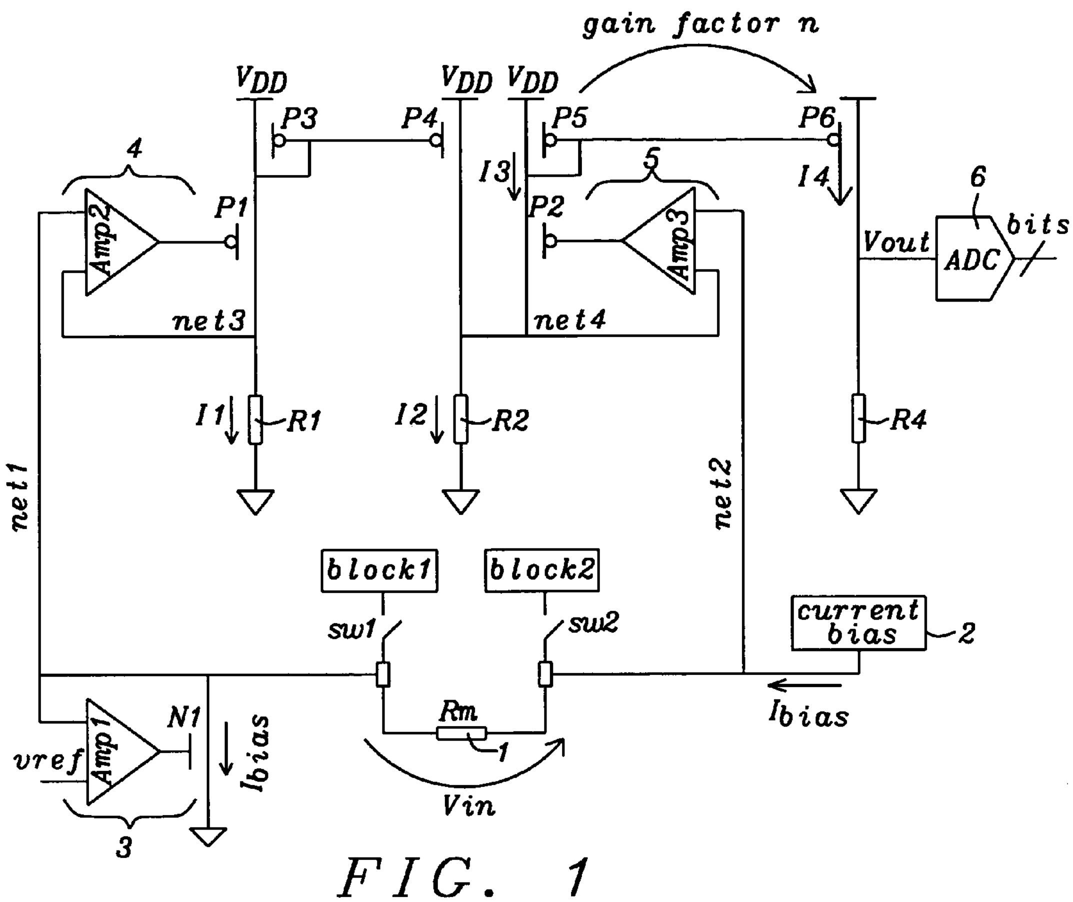
FIG. 1 shows a schematic of the circuit of the present invention.

FIG. 1 shows a principal schematic of a preferred embodiment of the present invention. It comprises the resistor Rm 1 to be measured, two switches Sw1 and Sw2 and block1 and block2. Block 1 and block 2 symbolize the circuitry of any application using resistor Rm 1 which has to be monitored regularly. Rm 1 could e.g. represent the Ron resistance of an external sensor or the resistance of a squib device or any other safety device. During the timeframe the application blocks 1 and 2 are in operation mode switches Sw1 and Sw2 are closed and all the other blocks of the circuit shown are turned off. This means in this operation mode the current source 2 is turned off and hence the current IBIAS is zero.

Furthermore the circuit of FIG. 1 comprises three amplifier configurations 3, 4, and 5. Their main purpose is to clamp voltage levels. The amplifier configuration 3 comprises the operational amplifier AMP1 and at its output the NMOS transistor N1, amplifier configuration 4 comprises the operational amplifier AMP2 and at its output the PMOS transistor P1, and amplifier configuration 4 comprises the operational amplifier AMP3 and at its output the PMOS transistor P2. The operational amplifier AMP1 has two inputs, a reference voltage VREF and a feedback loop from N1. The PMOS transistors P1 and P2 have the same size.

During the timeframe the resistance of Rm 1 is measured switches Sw1 and Sw2 are open and the current source block 2, amplifiers Amp 1, Amp 2, and Amp3 are all enabled and current IBIAS is flowing through Rm 1, causing the voltage drop Vm, and through NMOS transistor N1. The current source block 2 provides a constant current IBIAS, which is independent from process and temperature variations. In a preferred embodiment of the invention a current mirror configuration has been used to implement such a current source. Due to the infinite high input resistance of the operational amplifiers Amp1 and Amp2 the current IBIAS flows through Rm 1 and transistor N1. The voltage drop Vm is defined by:

$$Vm=Rm\times I\text{BIAS}. \tag{1}$$

During the measurement phase the operational amplifier Amp1 and transistor N1 clamp the voltage level at net1 to the level of the reference voltage VREF and they clamp the voltage level at net2 to the level VREF+Vm, this means to the sum of the reference voltage at Amp1 and of the voltage drop at Rm 1.

The operational amplifier Amp2 has two inputs, the voltage level of net1 and a feedback loop from the PMOS transistor P1. Therefore the operational amplifier Amp2 and transistor P1 clamp the voltage level at net3 to the level of the reference voltage VREF during the measurement phase and thus causing a current $I_1$ to flow through the resistor R1:

$$I_1 = \frac{V_{REF}}{R_1}.$$

The PMOS transistors P3 and P4 are connected in a current mirror configuration. They have both the same size and hence the same current $I_1$ is flowing through transistors P3 and P4.

The operational amplifier Amp3 and transistor P2 clamp the voltage level at net4 to the level VREF+Vm, this means to the sum of the reference voltage at Amp1 and the voltage drop at Rm 1 and thus causing a current $I_2$ to flow through the resistor R2:

$$I_2 = \frac{V_m + V_{REF}}{R_2}.$$

Resistors R1 and R2 are resistors of the same size and material and have both the resistance R.

Another current mirror is formed by the PMOS transistors P5 and P6. The channel-width of P6 is n-times larger than the channel-width of P5 while they have both the same channel-length. Therefore this current mirror has a current gain of the factor n. The current $I_3$ flowing through P5, this means a first branch of the P5/P6 current mirror is defined by $$I_3 = I_2 - I_1 = \frac{V_M + V_{REF}}{R_2} - \frac{V_{REF}}{R_1},$$

wherein
R2=R1=R.

$I_3$ is defined by:

$$I_3 = \frac{V_M}{R}. \tag{2}$$

The current $I_4$, flowing through transistor P6 in the second leg of the P5/P6 current mirror, is defined by amplification of current $I_3$ by the current gain factor n of the P5/P6 current mirror:

$I_4=n\times I_3$.

The current $I_4$ is flowing through resistor R4, which has the same resistance value R as resistors R1 and R2. The output voltage VOUT is defined by $VOUT=R\times I_4=R\times n\times I_3$ or using equations (1) and (2)

$$VOUT=n\times Rm\times IBIAS, \quad (3)$$

wherein n and IBIAS are well-known parameters. Finally equation (3) can be modified to calculate the resistance Rm:

$$Rm=\frac{V_{OUT}}{n\times I_{BIAS}}.$$

For further processing the value of VOUT is converted from analog to digital values by the analog-to-digital converter 6.

In the preferred embodiment all components of the circuit invented, with the exception of the resistor to be measured of course, have been integrated in an IC. The circuit described above could be implemented alternatively by interchanging all NMOS transistors by PMOS transistors and vice versa and by interchanging $V_{DD}$ voltage and ground voltage.

Figure 2:
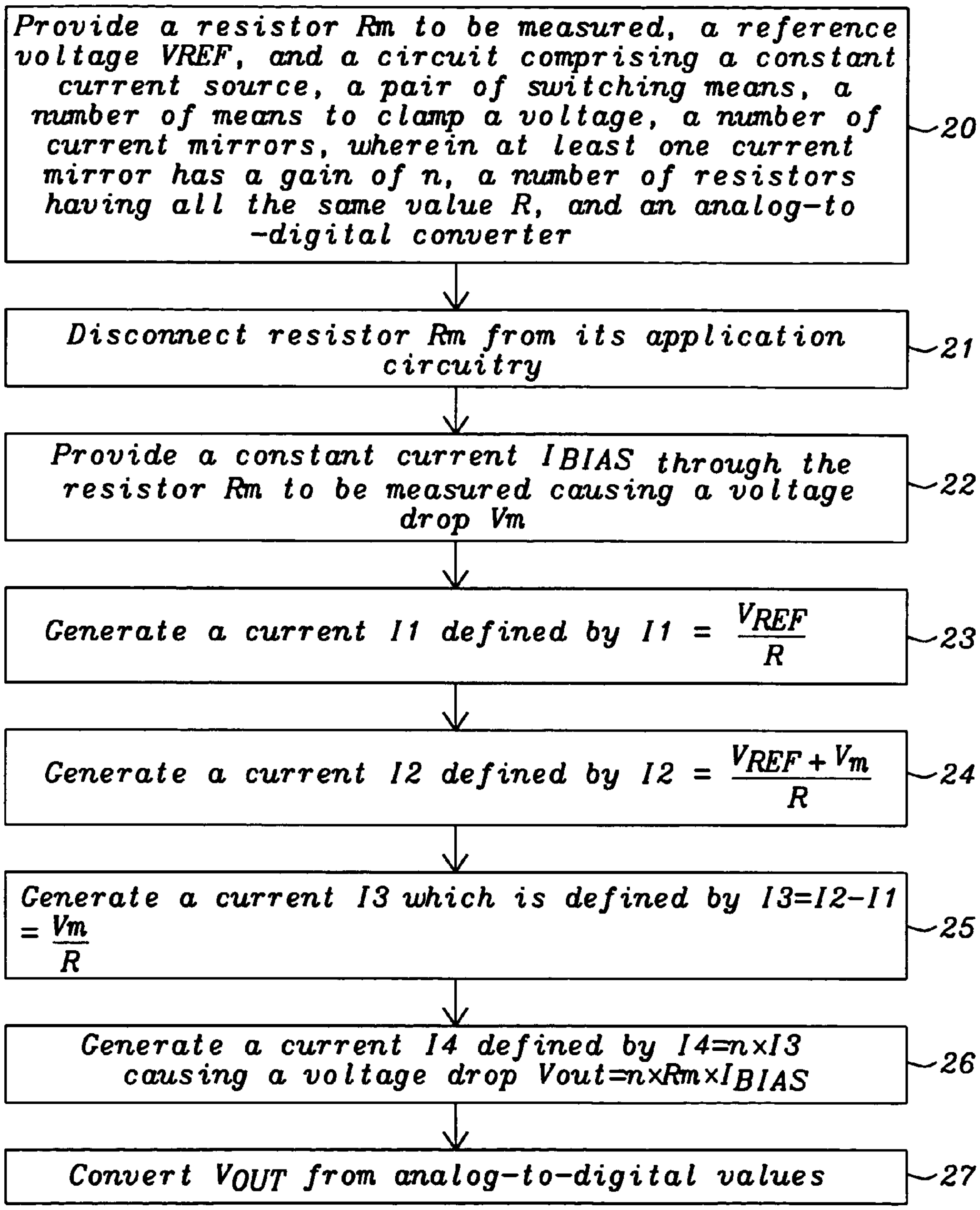
FIG. 2 illustrates a flowchart of a method to measure very precisely the resistance Rm of a small resistor.

FIG. 2 shows a flowchart of the principal steps of a method to measure very precisely the resistance of a small resistor independent from process and temperature variations. The first step 20 illustrates the provision of a resistor Rm to be measured, a reference voltage VREF, and a circuit comprising a constant current source, a pair of switching means, a number of means to clamp a voltage level, a number of current mirrors, wherein at least one current mirror has a gain of n, a number of resistors having all the same value R, and an analog-to digital converter.

In the next step 21 the resistor Rm is disconnected electrically from its application circuitry. In the following step 22 a constant current IBIAS is provided through the resistor Rm to be measured causing a voltage drop Vm and the next step 23 describes the generation of a current $I_1$ defined by $$I_1=\frac{V_{REF}}{R}.$$

In the following step 24 another current $I_2$ defined by $$I_2=\frac{V_{REF}+Vm}{R}$$

is generated and in step 25 a further current $I_3$, which is defined by $$I_3=I_2-I_1=\frac{V_m}{R},$$

is generated. Furthermore in step 26 a current $I_4$ defined by $I_4=n\times I_3$ causing a voltage drop $Vout=n\times Rm\times IBIAS$ is generated. In the last step 27 the voltage VOUT is converted from analog to digital values for further processing. As explained above the value of Rm can be deducted easily because the parameters IBIAS and the current gain n are known.

While the invention has been particularly shown and described with reference to the preferred embodiments thereof, it will be understood by those skilled in the art that various changes in form and details may be made without departing from the spirit and scope of the invention.

What is claimed is:

1. A circuit to measure very precisely the resistance of a small resistor independent from process and temperature variations is comprising:

a constant current source;

a resistor to be measured, wherein a first terminal of the resistor is connected to said current source, to a first input of a third means to clamp voltage and via a switch to any application circuitry, and a second terminal is connected to a first means to clamp voltage and via another switch to an application circuitry, wherein said both switches are open during a resistance measurement of the resistor;

a pair of switching means, wherein each of the switching means is between one terminal of said resistor to be measured and a circuitry of any application;

a first means to clamp voltage having two inputs and an output, wherein the first input is a reference voltage and the second input is a feedback from the output of said means to clamp voltage and wherein the current provided by said current source is flowing through the first means to clamp a voltage to ground and its output is connected to a first input of a second means to clamp a voltage;

a second means to a clamp a voltage having two inputs and an output, wherein the first input is the output of said first means to clamp a voltage and the second input is a feedback from its own output and it is generating at its output a current $I_1$ flowing from $V_{DD}$ voltage through a first resistor to ground;

a first, a second and a third resistor all are having the same resistance;

a first current mirror comprising a first and a second PMOS transistor, having both the same size, mirroring said current $I_1$;

a third means to clamp a voltage having two inputs and an output, wherein the first input connected to a first terminal of said resistor to be measured and the second input is a feedback from its own output and it is generating at its output a current $I_3$ flowing from $V_{DD}$ voltage and a current $I_2$ through a second resistor to ground, wherein $I_2$ and $I_3$ are connected to the mirrored current $I_1$ in a way that $I_3$ plus $I_1$ equals $I_2$;

a current mirror comprising a first and a second PMOS transistor, having a gain n, mirroring said current $I_3$, wherein the size of the second PMOS transistor is n-times larger than the size of the first transistor, and wherein a mirrored current $I_4$ is generated, amplified by the gain n, flowing via the third resistor to ground and providing an analog output voltage; and an analog-to digital converter converting said output voltage to digital values.

2. The circuit of claim 1 wherein all NMOS transistors are replaced by PMOS transistors and all PMOS transistors are replaced by NMOS transistors.

3. The circuit of claim 1 wherein said pair of switching means is a pair of transistors.

4. The circuit of claim 1 wherein said first means to clamp a voltage comprises an NMOS transistor and an operational amplifier having two inputs and an output, wherein the first input is a reference voltage and the second input is connected to the drain of the NMOS transistor and the output is connected to the gate of the NMOS transistor and wherein the source of the NMOS transistor is connected to ground and the drain is further connected to the second terminal of said resistor to be measured and to a first input of said second means to clamp a voltage.

5. The circuit of claim 1 wherein said second means to clamp a voltage comprises an PMOS transistor and an operational amplifier having two inputs and an output, wherein the first input is connected to the output of said first means to clamp a voltage and the second input is connected to the drain of the PMOS transistor and to a first terminal of said first resistor and the output is connected to the gate of the PMOS transistor and wherein the drain of the PMOS transistor is connected to the first terminal of the first resistor and the source is connected to the gate and to the drain of said first transistor of said first current mirror.

6. The circuit of claim 1 wherein said third means to clamp a voltage comprises an PMOS transistor and an operational amplifier having two inputs and an output, wherein the first input is connected to the first terminal of said resistor to be measured and the second input is connected to the drain of the PMOS transistor and to a first terminal of said second resistor and the output is connected to the gate of the PMOS transistor and wherein the drain of the PMOS transistor is connected to the first terminal of the second resistor and the source is connected to the gate and to the drain of said first transistor of said second current mirror.

7. The circuit of claim 1 wherein said constant current source is comprising a current mirror configuration.

8. The circuit of claim 1 wherein said circuit is integrated on an IC.

9. A method to measure very precisely the resistance of a small resistor independent from process and temperature variations is comprising:

providing a resistor Rm to be measured, a reference voltage VREF, and a circuit comprising a constant current source, a pair of switching means, a number of means to clamp a voltage, a number of current mirrors, wherein at least one current mirror has a gain of n, a number of resistors having all the same value R, and a analog-to digital converter;

disconnect resistor Rm from its application circuitry;

provide a constant current IBIAS through the resistor Rm to be measured causing a voltage drop Vm;

generate a current $I_1$ defined by $$I_1 = \frac{V_{REF}}{R};$$

generate a current $I_2$ defined by $$I_2 = \frac{V_{REF} + Vm}{R};$$

generate a current $I_3$ which is defined by $$I_3 = I_2 - I_1 = \frac{V_m}{R};$$

generate a current $I_4$ defined by $I_4=n\times I_3$ causing a voltage drop Vout= n×Rm×IBIAS; and convert VOUT from analog to digital values.

10. The method of claim 9 wherein said current $I_1$ is generated by voltage clamping of the reference voltage VREF.

11. The method of claim 9 wherein said current $I_2$ is generated by voltage clamping of the sum of the reference voltage VREF and the voltage drop Vm.

12. The method of claim 9 wherein a current mirrored from $I_1$ in the scale of 1:1 is used to get the current $I_3$ by subtraction of $I_2$ from said current mirrored from $I_1$.

13. The method of claim 9 wherein said current $I_4$ is generated by mirroring current $I_3$ using a mirroring scale of n.

* * * * *